(12) United States Patent
Mugiya et al.

(10) Patent No.: US 9,455,209 B2
(45) Date of Patent: Sep. 27, 2016

(54) CIRCUIT MODULE AND PRODUCTION METHOD THEREFOR

(71) Applicant: Taiyo Yuden Co., Ltd., Tokyo (JP)

(72) Inventors: Eiji Mugiya, Tokyo (JP); Masaya Shimamura, Tokyo (JP); Kenzo Kitazaki, Tokyo (JP); Takehiko Kai, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 399 days.

(21) Appl. No.: 14/148,240

(22) Filed: Jan. 6, 2014

(65) Prior Publication Data
US 2014/0293550 A1 Oct. 2, 2014

(30) Foreign Application Priority Data

Apr. 2, 2013 (JP) .................................. 2013-076887

(51) Int. Cl.
*H01L 23/28* (2006.01)
*H05K 3/28* (2006.01)
(Continued)

(52) U.S. Cl.
CPC .............. *H01L 23/28* (2013.01); *H01L 21/561* (2013.01); *H01L 23/552* (2013.01); *H01L 24/97* (2013.01); *H05K 1/0218* (2013.01); *H05K 3/284* (2013.01); *H05K 3/285* (2013.01); *H01L 2224/16225* (2013.01); *H01L 2224/32225* (2013.01); *H01L 2224/48227* (2013.01); *H01L 2224/97* (2013.01); *H01L 2924/12042* (2013.01); *H01L 2924/1461* (2013.01); *H01L 2924/1531* (2013.01);
(Continued)

(58) Field of Classification Search
USPC ................................................ 361/728, 736
IPC .......................................... H01L 23/28,23/552
See application file for complete search history.

(56) References Cited

U.S. PATENT DOCUMENTS

2012/0140423 A1\* 6/2012 Fisher, Jr. .............. H05K 3/284
361/748
2013/0301227 A1 11/2013 Kawano
(Continued)

FOREIGN PATENT DOCUMENTS

| JP | 2011-151274 A | 8/2011 |
|---|---|---|
| WO | WO-2011-111318 A1 | 9/2011 |
| WO | WO-2012-101920 A1 | 8/2012 |

OTHER PUBLICATIONS

Office Action dated Jun. 3, 2014 in Japanese Application No. 2013-076887.

*Primary Examiner* — David Warren
(74) *Attorney, Agent, or Firm* — Saliwanchik, Lloyd & Eisenschenk

(57) ABSTRACT

A circuit module includes: a wiring substrate including a mounting surface having first and second areas and a terminal surface on the other side of the mounting surface; a plurality of electronic components mounted on the first and second areas; a sealing layer that covers the plurality of electronic components, is formed of an insulation material, and includes a groove portion formed along a boundary between the first and second areas; a conductive shield including a first shield portion that covers an outer surface of the sealing layer and a second shield portion provided in the groove portion; and a conductive layer including a wiring portion that is provided on the mounting surface and electrically connects the terminal surface and the second shield portion, and a thickening portion that is provided in the wiring portion and partially thickens a connection area of the wiring portion with the second shield portion.

9 Claims, 14 Drawing Sheets

(51) Int. Cl.
  *H01L 23/552*   (2006.01)
  *H01L 21/56*    (2006.01)
  *H01L 23/00*    (2006.01)
  *H05K 1/02*     (2006.01)
  *H05K 1/09*     (2006.01)
  *H05K 3/00*     (2006.01)

(52) U.S. Cl.
  CPC ........... *H01L2924/15192* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H05K 1/095* (2013.01); *H05K 3/0052* (2013.01); *H05K 2203/1316* (2013.01)

(56) References Cited

U.S. PATENT DOCUMENTS

| | | | |
|---|---|---|---|
| 2014/0252569 A1* | 9/2014 | Ikuma | H01L 23/66 257/659 |
| 2014/0293550 A1* | 10/2014 | Mugiya | H05K 1/0218 361/728 |
| 2015/0016066 A1* | 1/2015 | Shimamura | H01L 23/3121 361/728 |
| 2015/0043170 A1* | 2/2015 | Shimamura | H01L 23/3121 361/728 |
| 2015/0043171 A1* | 2/2015 | Mugiya | H05K 7/06 361/728 |
| 2015/0043189 A1* | 2/2015 | Kitazaki | H01L 23/3121 361/816 |
| 2015/0062835 A1* | 3/2015 | Kai | H05K 9/003 361/748 |
| 2015/0070849 A1* | 3/2015 | Shimamura | H05K 1/0216 361/728 |
| 2015/0070851 A1* | 3/2015 | Kitazaki | H05K 3/301 361/729 |
| 2015/0171056 A1* | 6/2015 | Goto | H01L 25/0655 438/107 |
| 2015/0179616 A1* | 6/2015 | Lin | H01L 25/50 257/773 |
| 2015/0311095 A1* | 10/2015 | Okada | H01L 23/4334 257/673 |
| 2016/0093576 A1* | 3/2016 | Chiu | H01L 23/552 257/659 |

\* cited by examiner

CIRCUIT MODULE AND PRODUCTION METHOD THEREFOR

CROSS-REFERENCE TO RELATED APPLICATION

This application claims the benefit under 35 U.S.C. §119 of Japanese Patent Application No. 2013-076887, filed Apr. 2, 2013, which is hereby incorporated by reference in its entirety.

BACKGROUND OF THE INVENTION

The present disclosure relates to a circuit module including an electromagnetic shield function and a production method therefor.

There is known a circuit module in which a plurality of electronic components are mounted on a substrate, the circuit module being mounted on various electronic apparatuses. In such a circuit module, a structure including an electromagnetic shield function for preventing electromagnetic waves from leaking to an outside of the module and preventing electromagnetic waves from entering from the outside is adopted in general.

Further, along with a diversification and functional sophistication of electronic components mounted in the circuit module, various devices for preventing electromagnetic interferences from occurring among the plurality of electronic components are being proposed. For example, Japanese Patent Application Laid-open No. 2010-225620 (paragraph (0034); hereinafter, referred to as Patent Document 1) discloses a circuit module in which a slit that penetrates a mold resin layer and reaches a circuit substrate is formed between two electronic components on the substrate and a conductive resin is filled inside the slit. Moreover, Japanese Patent Application Laid-open No. 2012-019091 (paragraphs (0023) and (0034); hereinafter, referred to as Patent Document 2) discloses a module in which a shield conducting wall between circuit blocks is formed by a plurality of conductive components mounted on a circuit substrate or a conductive paste or conductive paint filled inside a groove formed on a mold resin.

Patent Document 1: Japanese Patent Application Laid-open No. 2010-225620 (paragraph (0034))
Patent Document 2: Japanese Patent Application Laid-open No. 2012-019091 (paragraphs (0023) and (0034))

BRIEF SUMMARY

However, since a dicing method is adopted in forming the slit that penetrates the mold resin layer in the structure disclosed in Patent Document 1, the shape of the slit is limited to a linear shape, and a bent or branched slit cannot be formed. As a result, a shape of an inner shield becomes limited, and thus a mounting layout of components becomes limited. In addition, since a depth of the slit cannot be controlled with high accuracy in the dicing method, it is difficult to bring a bottom portion of the slit and a wiring layer right below the slit into electrical contact.

On the other hand, since the shield conducting wall is constituted of the plurality of conductive components mounted on the circuit substrate in the structure disclosed in Patent Document 2, an increase in production costs due to an increase in the number of components and the number of mounting processes is difficult to be suppressed.

Moreover, Patent Document 2 discloses a technique of forming the groove in which the conductive paste or conductive paint is filled by a laser process using the mold resin.

In this method, the groove is formed by adjusting an intensity of laser light, but since a damage on wirings on the substrate is difficult to be avoided when the laser light intensity is too high and a processing efficiency of the mold resin is lowered and productivity is difficult to be maintained when the laser light intensity is too low, there is a problem that it is difficult to optimally set the laser light intensity.

In view of the circumstances as described above, there is a need for a circuit module having a high degree of freedom of a shield shape and with which an electrical connection between a wiring layer and a shield can be secured, and a production method therefor.

According to an embodiment of the present disclosure, there is provided a circuit module including a wiring substrate, a plurality of electronic components, a sealing layer, a conductive shield, and a conductive layer.

The wiring substrate includes a mounting surface having a first area and a second area and a terminal surface on the other side of the mounting surface.

The plurality of electronic components are mounted on the first area and the second area.

The sealing layer covers the plurality of electronic components, is formed of an insulation material, and includes a groove portion formed along a boundary between the first area and the second area.

The conductive shield includes a first shield portion that covers an outer surface of the sealing layer and a second shield portion provided in the groove portion.

The conductive layer includes a wiring portion that is provided on the mounting surface and electrically connects the terminal surface and the second shield portion, and a thickening portion that is provided in the wiring portion and partially thickens a connection area of the wiring portion with respect to the second shield portion.

Further, according to an embodiment of the present disclosure, there is provided a production method for a circuit module including preparing a wiring substrate in which a plurality of electronic components are mounted on a first area and a second area of a mounting surface and a metal component is mounted on at least a part of a boundary between the first area and the second area.

A sealing layer that is formed of an insulation material and covers the plurality of electronic components is formed on the mounting surface.

On the sealing layer, by irradiating laser light onto a front surface of the sealing layer, a groove portion having a depth with which the metal component is exposed is formed along the boundary between the first area and the second area.

A conductive shield is formed by filling a conductive resin in the groove portion and covering an outer surface of the sealing layer with the conductive resin.

Further, according to another embodiment of the present disclosure, there is provided a production method for a circuit module including preparing a wiring substrate in which a plurality of electronic components are mounted on a first area and a second area of a mounting surface, the wiring substrate including a conductive layer thickened by a metal layer in at least a part of a boundary between the first area and the second area.

A sealing layer that is formed of an insulation material and covers the plurality of electronic components is formed on the mounting surface.

On the sealing layer, by irradiating first laser light onto a front surface of the sealing layer, a groove portion having a depth with which the conductive layer is almost exposed is formed along the boundary between the first area and the second area.

By irradiating second laser light onto a bottom portion of the groove portion at a position right above an area where the metal layer of the conductive layer is provided, the area is exposed via the groove portion.

A conductive shield is formed by filling a conductive resin in the groove portion and covering an outer surface of the sealing layer with the conductive resin.

DETAILED DESCRIPTION

Figure 1:
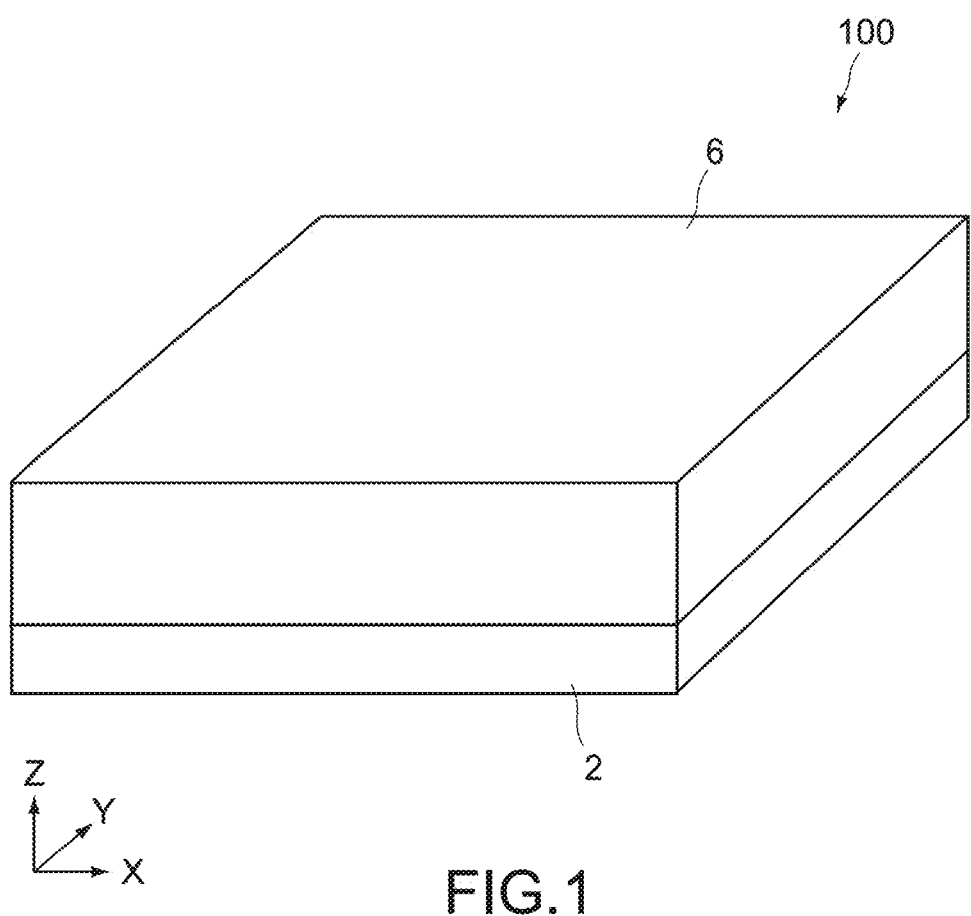
FIG. 1 is a perspective view showing a circuit module according to a first embodiment of the present disclosure.

According to an embodiment of the present disclosure, there is provided a circuit module including a wiring substrate, a plurality of electronic components, a sealing layer, a conductive shield, and a conductive layer.

The wiring substrate includes a mounting surface having a first area and a second area and a terminal surface on the other side of the mounting surface.

The plurality of electronic components are mounted on the first area and the second area.

The sealing layer covers the plurality of electronic components, is formed of an insulation material, and includes a groove portion formed along a boundary between the first area and the second area.

The conductive shield includes a first shield portion that covers an outer surface of the sealing layer and a second shield portion provided in the groove portion.

The conductive layer includes a wiring portion that is provided on the mounting surface and electrically connects the terminal surface and the second shield portion, and a thickening portion that is provided in the wiring portion and partially thickens a connection area of the wiring portion with respect to the second shield portion.

Since the thickening portion has a function of partially thickening the connection area of the wiring portion with respect to the second shield portion, a burnout of the wiring portion due to the irradiation of laser light can be avoided when forming the groove portion of the resin layer by laser processing. Specifically, while laser light reaches at least the area of the wiring portion where the thickening portion is provided faster than other areas, since the thickening portion is subjected to cutting processing in place of the wiring portion, the wiring portion can be effectively protected from being cut or burnt by the laser irradiation. Accordingly, it becomes possible to secure an electrical connection between the wiring portion and the second shield portion provided in the groove portion, and a degree of freedom in design of a shield shape can be enhanced since the groove portion can be formed in an arbitrary shape.

The thickening portion may be provided in the vicinity of an end portion of the groove portion.

The end portion of the groove portion refers to a start point or end point of the groove portion, that is, an irradiation start position or an irradiation end position of laser light when the groove portion is formed by the laser processing. Moreover, the vicinity of the end portion of the groove portion includes a position right below the end portion and a periphery thereof.

The thickening portion may be provided right below a portion where the groove portion is bent or branched.

Since the laser light is irradiated onto such a position more times than other positions, an influence on the wiring portion is large. Therefore, by providing the thickening portion on the wiring portion corresponding to the bent portion when the wiring portion is provided at the bent portion of the groove portion, the wiring portion can be protected from the laser light irradiation.

Here, the portion where the groove portion is bent includes a bent portion where the groove portion is bent at a blunt or sharp angle, a curved portion where the groove portion is softly curved, and the like. Moreover, the portion where the groove portion is branched includes a portion where a plurality of groove portions cross, a portion where the plurality of groove portions are coupled in a T-shape, and the like.

The thickening portion may be a metal layer that is formed in the connection area and includes one of a solder, copper, nickel, and brass.

Since a solder, copper, nickel, brass, and the like have high reflectance with respect to laser light, the metal layer as the thickening portion can be made to function as a reflection layer. With this structure, the wiring portion can be effectively protected from laser light.

The thickening portion may be a metal component mounted in the connection area.

Specifically, the thickening portion may be constituted of a different member from the wiring portion, and thus the thickening portion can be provided at a desired position on the wiring portion in accordance with the shield shape, with the result that the degree of freedom in design can be additionally enhanced. Further, since the metal component is a good conductor of electricity, a favorable electrical connection between the second shield portion and the wiring portion can be realized. Furthermore, since the metal component does not need to be mounted across the entire area of the wiring portion positioned right below the second shield portion, an increase in the number of components and number of mounting processes can be suppressed.

The thickening portion may be a through-hole via formed in the connection area.

Even with such a structure, the wiring portion can be partially thickened, with the result that the wiring portion can be effectively protected from the irradiation of laser light.

The second shield portion may be a cured object of a conductive resin filled inside the groove portion or one of a plated film and a sputtered film filled inside an inner wall of the groove portion.

According to an embodiment of the present disclosure, there is provided a production method for a circuit module including preparing a wiring substrate in which a plurality of electronic components are mounted on a first area and a second area of a mounting surface and a metal component is mounted on at least a part of a boundary between the first area and the second area.

A sealing layer that is formed of an insulation material and covers the plurality of electronic components is formed on the mounting surface.

On the sealing layer, by irradiating laser light onto a front surface of the sealing layer, a groove portion having a depth with which the metal component is exposed is formed along the boundary between the first area and the second area.

A conductive shield is formed by filling a conductive resin in the groove portion and covering an outer surface of the sealing layer with the conductive resin.

Further, according to another embodiment of the present disclosure, there is provided a production method for a circuit module including preparing a wiring substrate in which a plurality of electronic components are mounted on a first area and a second area of a mounting surface, the wiring substrate including a conductive layer thickened by a metal layer in at least a part of a boundary between the first area and the second area.

A sealing layer that is formed of an insulation material and covers the plurality of electronic components is formed on the mounting surface.

On the sealing layer, by irradiating first laser light onto a front surface of the sealing layer, a groove portion having a depth with which the conductive layer is almost exposed is formed along the boundary between the first area and the second area.

By irradiating second laser light onto a bottom portion of the groove portion at a position right above an area where the metal layer of the conductive layer is provided, the area is exposed via the groove portion.

A conductive shield is formed by filling a conductive resin in the groove portion and covering an outer surface of the sealing layer with the conductive resin.

According to the production method for a circuit module, since a laser processing method is used in forming the groove portion, the groove portion can be formed in an arbitrary shape as compared to a case of forming the groove portion by a dicing method, for example. Accordingly, the degree of freedom in design of the shield shape can be enhanced. Moreover, since the metal component or metal layer is provided in at least a part of the area where the groove portion is formed, the wiring substrate and the wiring portion formed on the surface of the wiring substrate can be protected from the irradiation of laser light.

Hereinafter, embodiments of the present disclosure will be described with reference to the drawings.

First Embodiment

Figure 2:
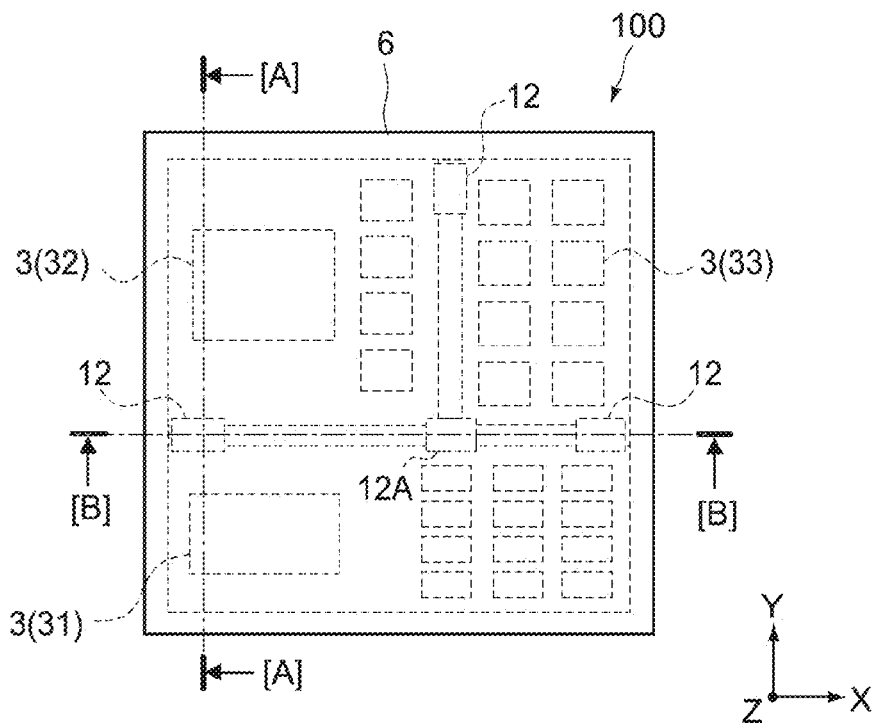
FIG. 2 is a plan view of the circuit module.
Figure 3:
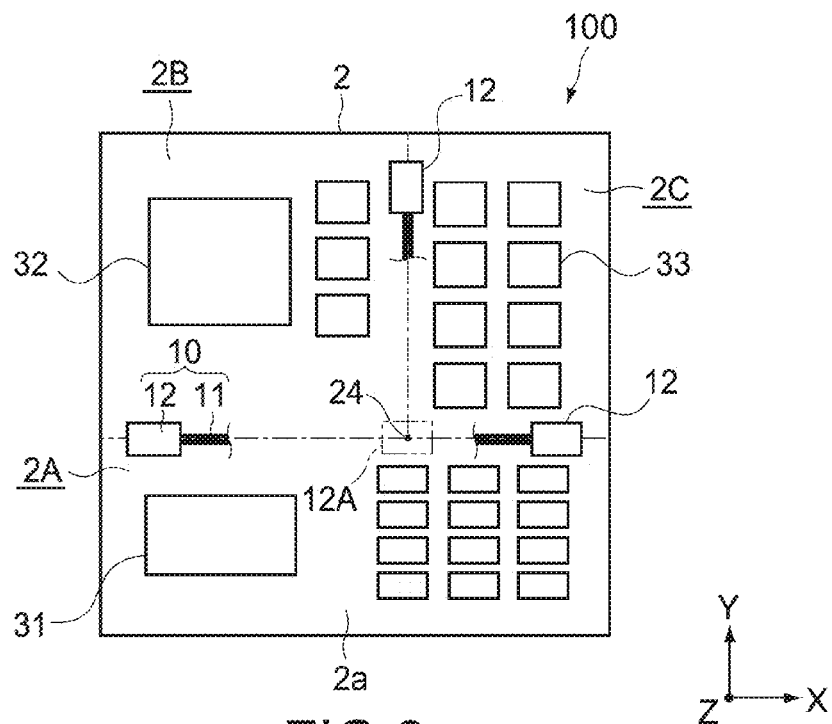
FIG. 3 is a plan view of a circuit substrate on which electronic components are mounted in the circuit module.
Figure 4:
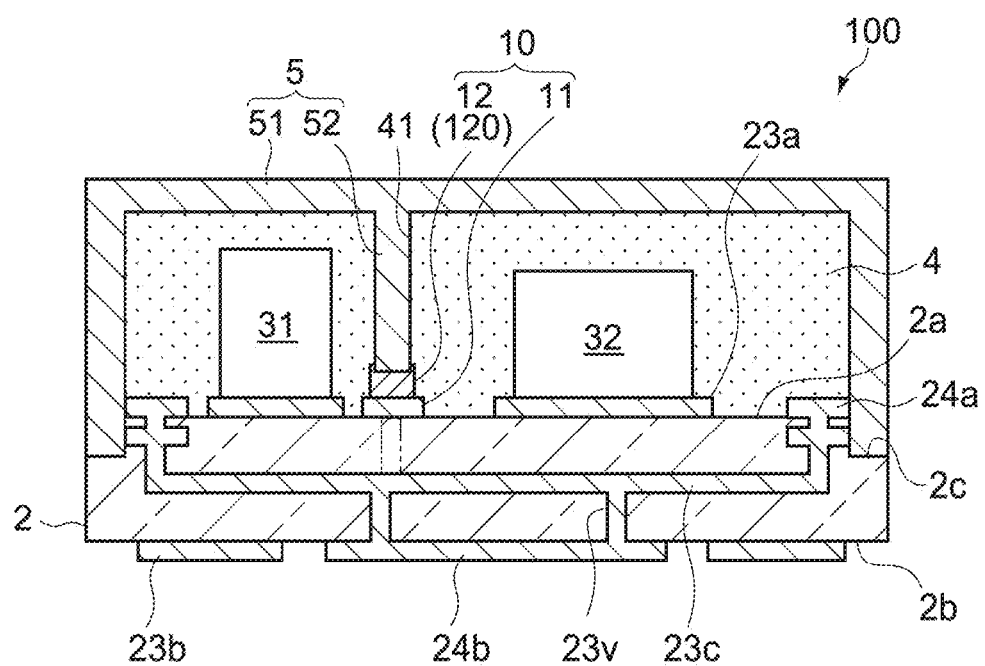
FIG. 4 is a cross-sectional diagram taken along the line (A)-(A) of FIG. 2.
Figure 4:
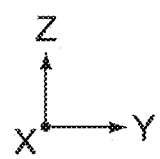
Figure 5:
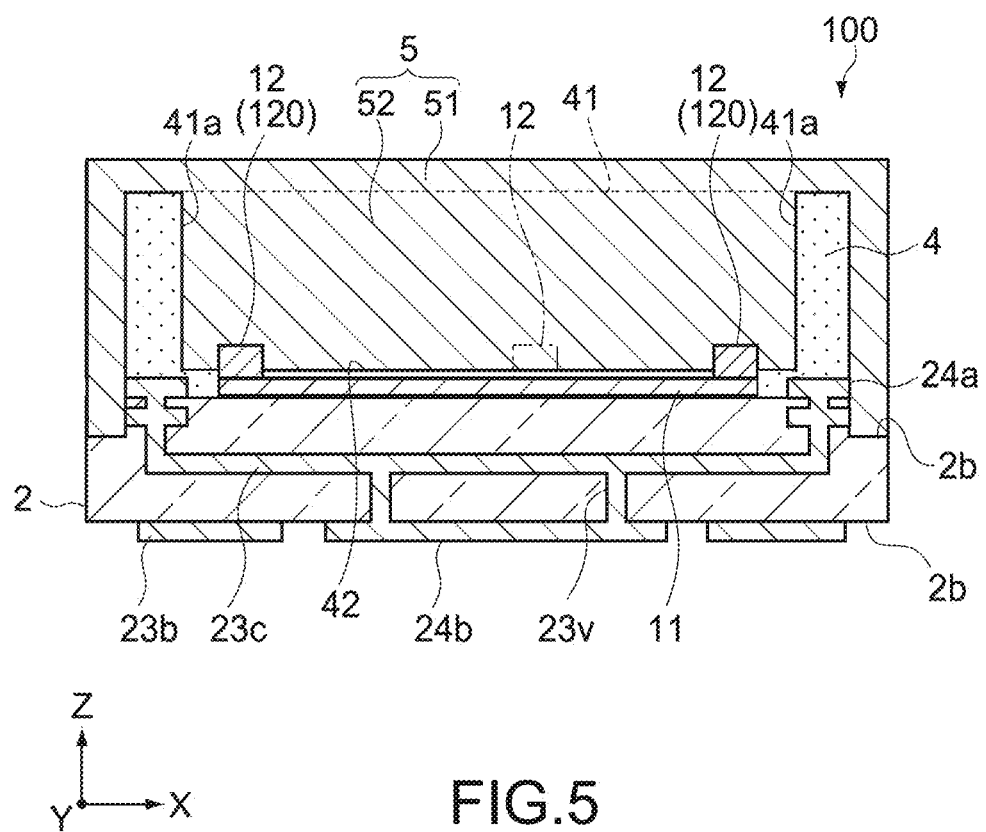
FIG. 5 is a cross-sectional diagram taken along the line (B)-(B) of FIG. 2.

FIGS. 1 to 5 are diagrams each showing a circuit module according to an embodiment of the present disclosure. FIG. 1 is a perspective view, FIG. 2 is a plan view, FIG. 3 is a plan view of a circuit substrate on which electronic components are mounted, FIG. 4 is a cross-sectional diagram taken along the line (A)-(A) of FIG. 2, and FIG. 5 is a cross-sectional diagram taken along the line (B)-(B) of FIG. 2.

It should be noted that in the figures, X, Y, and Z axes indicate mutually-orthogonal triaxial directions, and the Z-axis direction corresponds to a thickness direction of the circuit module. It should be noted that to held understand the figures, structures of respective portions are illustrated exaggeratedly, and sizes of members or a ratio of the sizes among the members do not necessarily correspond.

Structure of Circuit Module

A circuit module 100 of this embodiment includes a wiring substrate 2, a plurality of electronic components 3, a sealing layer 4, a conductive shield 5, and a conductive layer 10.

The circuit module 100 is practically cuboid as a whole. A size of the circuit module 100 is not particularly limited, and lengths along the X- and Y-axis directions are set to be 10 mm to 50 mm, for example. In this embodiment, the circuit module 100 is formed in a practically-square shape having a side of about 35 mm. In addition, a thickness is also not particularly limited and set to be, for example, 1 mm to 3 mm. In this embodiment, the thickness is about 2 mm.

In the circuit module 100, the plurality of electronic components 3 are mounted on the wiring substrate 2, and the sealing layer 4 and the conductive shield 5 are formed to cover the plurality of electronic components 3. Hereinafter, the structures of the respective portions of the circuit module 100 will be described.

Wiring Substrate

The wiring substrate 2 includes a practically-square mounting surface 2A having the same size as the entire circuit module 100, for example, and a terminal surface 2B on the other side of the mounting surface 2A, and is constituted of a glass-epoxy-based multilayer wiring substrate having a thickness of, for example, about 0.4 mm. A material constituting an insulation layer of the wiring substrate 2 is not limited to a glass-epoxy-based material, and a ceramic material having an insulation property can also be adopted, for example.

The wiring layer of the wiring substrate 2 is typically formed of a copper foil and provided on each of a front surface, back surface, and inner layer portion of the wiring substrate 2. By patterning each of the wiring layers in a predetermined shape, an upper layer wiring portion 23a provided on the mounting surface 2A, a lower layer wiring portion 23b provided on the terminal surface 2B, and an inner layer wiring portion 23c provided between the upper layer wiring portion 23a and the lower layer wiring portion 23b are structured. The upper layer wiring portion 23a includes a land portion on which the electronic components 3 are mounted, and the lower layer wiring portion 23b includes an external connection terminal to be connected to a control substrate (not shown) of an electronic apparatus on which the circuit module 100 is to be mounted. The wiring portions of the layers are electrically connected to one another via a via conductor 23v.

The wiring layer includes a first GND terminal 24a and a second GND terminal 24b connected to a ground (GND) potential. The first GND terminal 24a is provided adjacent to a step portion 2C formed on an upper circumferential portion of the wiring substrate 2 and connected to an inner surface of a first shield portion 51 (conductive shield 5) provided on the step portion 2C. The first GND terminal 24a may be formed as a part of the upper layer wiring portion 23a or a part of the inner layer wiring portion 23c.

The second GND terminal 24b is connected to the first GND terminal 24a via the inner layer wiring portion 23c. The second GND terminal 24b is formed as a part of the lower layer wiring portion 23b and connected to a ground wiring of the control substrate.

The mounting surface 2A is sectioned into a plurality of areas by a second shield portion 52 (conductive shield 5) and includes a first area 2A, a second area 2B, and a third area 2C in this embodiment. In the example shown in the figures, the first to third areas 2A to 2C are formed in rectangular shapes having different sizes and shapes, but the areas may be formed in a triangle or other polygonal shapes of a pentagon or more, or may be formed in an arbitrary geometric shape such as a circle and an oval. Moreover, the number of areas sectioned on the mounting surface 2A is not limited to 3 described above, and may be 2 or 4 or more.

Electronic Component

The plurality of electronic components 3 are mounted on the first to third areas 2A to 2C of the mounting surface 2A. Typically, the plurality of electronic components 3 include various components such as an integrated circuit (IC), a capacitor, an inductor, a resistor, a crystal oscillator, a duplexer, a filter, and a power amplifier.

Those components include a component that generates electromagnetic waves in the periphery during an operation and a component that is apt to be influenced by the electromagnetic waves. Typically, the components as described above are mounted on the mutually-different areas sectioned by the second shield portion 52 (conductive shield 5). Hereinafter, a single electronic component 3 or the plurality of electronic components 3 mounted on the first area 2A is/are also referred to as electronic component 31, and a single electronic component 3 or the plurality of electronic components 3 mounted on the second area 2B is/are also referred to as electronic component 32. Moreover, a single electronic component 3 or the plurality of electronic components 3 mounted on the third area 2C is/are also referred to as electronic component 33.

The plurality of electronic components 3 are typically mounted on the mounting surface 2A by a solder, an adhesive, a bonding wire, and the like.

Sealing Layer

The sealing layer 4 is formed of an insulation material formed on the mounting surface 2A so as to cover the plurality of electronic components 31 and 32. The sealing layer 4 is divided into the first area 2A side, the second area 2B side, and the third area 2C side by the second shield portion 52. In this embodiment, the sealing layer 4 is formed of a resin having an insulation property, such as an epoxy resin to which silica or alumina is added. The method of forming the sealing layer 4 is not particularly limited and may be formed by, for example, a mold forming method.

Moreover, the sealing layer 4 includes a groove portion 41 formed along boundaries of the first area 2A, the second area 2B, and the third area 2C. The groove portion 41 is formed along the Z-axis direction with a predetermined depth from an upper surface of the sealing layer 4. In this embodiment, the groove portion 41 is formed with a depth at which a bottom surface of the groove portion 41 reaches an upper surface of a conductive layer 10 arranged on the mounting surface 2A.

The method of forming the groove portion 41 is not particularly limited, and in this embodiment, the groove portion 41 is formed by a laser processing technique as will be described later.

Conductive Shield

The conductive shield 5 includes a first shield portion 51 and a second shield portion 52. The first shield portion 51 is structured to cover an outer surface of the sealing layer 4 (surface including upper and side surfaces of sealing layer 4; same holds true in descriptions below) and functions as an outer shield of the circuit module 100. The second shield portion 52 is provided in the groove portion 41 of the sealing layer 4 and functions as an inner shield of the circuit module 100.

The conductive shield 5 is constituted of a cured object of a conductive resin material formed on the outer surface of the sealing layer 4 and filled inside the groove portion 41. More specifically, an epoxy resin to which conductive particles of Ag, Cu, and the like are added is adopted. Alternatively, the conductive shield 5 may be a plated film or sputtered film deposited on the outer surface of the sealing layer 4 and an inner wall of the groove portion 41.

With such a structure, the first shield portion 51 and the second shield portion 52 can be formed by the same process. In addition, the first shield portion 51 and the second shield portion 52 can be formed integrally.

Conductive Layer

The conductive layer 10 includes a wiring portion 11 and a thickening portion 12.

The wiring portion 11 is provided on the mounting surface 2A and formed on at least a part of the boundary portion of the first to third areas 2A to 2C in particular. Specifically, the wiring portion 11 only needs to include an area that is at least partially connected with the second shield portion 52 (connection area), and the wiring portion 11 may be formed only in an area right below the second shield portion 52 or may be formed in other areas, for example.

The wiring portion 11 constitutes a part of the upper layer wiring portion 23a and typically has a thickness equivalent to that of the upper layer wiring portion 23a (e.g., 10 µm to 15 µm). Although not shown, the wiring portion 11 is connected to the second GND terminal 24b on the terminal surface 2B via the via conductor 23v and the inner layer wiring portion 23c.

Although the wiring portion 11 is typically constituted of a copper wiring, NiAu plating may be performed thereon. Accordingly, a reflectance with respect to laser light increases, and a laser damage in forming the groove portion 41 can be alleviated.

The thickening portion 12 is provided on at least a part of the wiring portion 11 opposing the groove portion 41 of the sealing layer 4 and provided for partially thickening the connection area of the wiring portion 11 with respect to the second shield portion 52. The thickening portion 12 is provided for protecting the wiring portion 11 from an irradiation of laser light in the process of forming the groove portion 41 and provided in the vicinity of an end portion 41a of the groove portion 41 as shown in FIG. 5, for example.

Here, the end portion 41a of the groove portion 41 refers to a start point or end point of the groove portion 41, that is, an irradiation start position or irradiation end position of laser light in forming the groove portion 41 by the laser processing. The vicinity of the end portion 41a includes a position right below the end portion 41a and a periphery thereof. As an example where the thickening portion 12 is provided at the position right below the end portion 41a, there is a case where the wiring portion 11 is positioned right below the end portion 41a. As an example where the thickening portion 12 is provided in the periphery of the position right below the end portion 41a, there is a case where the wiring portion 11 is positioned in the periphery of the position right below the end portion 41a.

The thickening portion 12 may be provided right below a portion where the groove portion 41 is bent or a portion where the groove portion 41 is branched (hereinafter, also referred to as bent portion). Since such a position is irradiated with laser light more times than other positions, an influence on the wiring portion 11 is large when the wiring portion 11 is provided at such a position. Therefore, by providing the thickening portion 12 on the wiring portion 11 corresponding to the bent portion when the wiring portion 11 is provided at the bent portion of the groove portion 41 and the like, the wiring portion 11 can be protected from the laser light irradiation.

Here, the portion where the groove portion 41 is bent includes a bent portion where the groove portion 41 is bent at a blunt or sharp angle, a curved portion where the groove portion 41 is softly curved, and the like. Moreover, the portion where the groove portion 41 is branched includes a portion where a plurality of groove portions cross, a portion where the plurality of groove portions are coupled in a T-shape, and the like. For example, a state where the thickening portion 12 is provided at an intersection 24 of a boundary between the first area 2A and the second area 2B and a boundary between the second area 2B and the third area 2C is shown in FIGS. 2 and 3.

In this embodiment, the thickening portion 12 is constituted of a metal component 120 mounted on the connection area of the wiring portion 11 with respect to the second shield portion 52 (FIGS. 4 and 5). By bonding the metal component 120 to the wiring portion 11 via a solder or a conductive paste, the metal component 120 is electrically and mechanically connected to the wiring portion 11. It is favorable to fix the metal component 120 onto the wiring portion 11 so that an unnecessary positional fluctuation is prevented from occurring.

The material for forming the metal component 120 is not particularly limited, and the metal component 120 is formed of, for example, a solder, copper, nickel, or brass. Moreover, by using a metal material having high reflectance characteristics with respect to laser light used for forming the groove portion 41 as the metal component 120, the connection area of the wiring portion 11 can be effectively protected from the laser light irradiation.

Further, by constituting the metal component 120 of a different member from the wiring portion 11, the thickening portion 12 can be provided at a desired position on the wiring portion 11 in accordance with the shape of the second shield portion 52, and thus a degree of freedom in design can be additionally enhanced. Furthermore, since the metal component 120 is a good conductor of electricity, a favorable electrical connection between the second shield portion 52 and the wiring portion 11 can be realized. Furthermore, since the metal component 120 does not need to be mounted across the entire area of the wiring portion 11 positioned right below the second shield portion 52, an increase in the number of components and number of mounting processes can be suppressed.

The thickness of the metal component 120 (thickening portion 12) is not particularly limited, but at least a thickness with which a meltdown or excessive cutting of the wiring portion 11 right below the groove portion 41 due to laser light irradiated when forming the groove portion 41 can be prevented is necessary. Although the protection effect of the wiring portion 11 right below the thickening portion 12 can be enhanced as the thickness of the thickening portion 12 increases, it becomes difficult to form the groove portion 41 with a desired depth, and thus there is a fear that the shield effect may be lowered since the height of the second shield portion 52 also decreases. In other words, the thickness of the thickening portion 12 can be set as appropriate within a range in which the protection function of the wiring portion 11 and a desired shield effect by the second shield portion 52 can be secured.

On the other hand, as shown in FIG. 5, an insulation layer 42 may be inserted between the bottom portion of the second shield portion 52 (i.e., bottom portion of groove portion 41) and the wiring portion 11. The insulation layer 42 is typically formed of the same resin material as the sealing layer 4 or a decomposition product of the resin material. In other words, the insulation layer 42 may be a part of the sealing layer 4 that has remained on the front surface of the wiring portion 11 when forming the groove portion 41 by the laser processing method or a decomposition product of the material forming the sealing layer 4 obtained by the laser irradiation heat.

Although the insulation layer 42 inhibits a conduction between the second shield portion 52 and the wiring portion 11, since a favorable conduction can be secured between the second shield portion 52 and the wiring portion 11 via the thickening portion 12 (metal component 120), the shield function is not affected. Further, by forming the groove portion 41 such that the insulation layer 42 is formed on the front surface of the wiring portion 11, it is possible to prevent laser light from being directly irradiated onto the wiring portion 11 and thus protect the wiring portion 11.

The size of the metal component 120 (thickening portion 12) is also not particularly limited, and the metal component 120 is formed to have an area larger than a spot diameter of laser light used in forming the groove portion 41, for example. Further, by being formed in a size capable of covering the wiring portion 11 (connection area) right below the groove portion 41, the metal component 120 becomes effective in protecting the wiring portion 11. Typically, the metal component 120 is formed with a width larger than a width (groove width) of the groove portion 41.

Production Method for Circuit Module

Next, a production method for the circuit module 100 of this embodiment will be described.

FIGS. 6 to 12 are diagrams for explaining the production method for the circuit module 100. In the figures of FIGS. 7 to 12, A is an upper view, and B is a cross-sectional diagram of a main portion seen in the X-axis direction. The production method for the circuit module of this embodiment includes an assembly substrate preparation process, an electronic component mounting process, a sealing layer forming process, a half-cut process, a groove portion forming process, a conductive shield forming process, and a cutout process. Hereinafter, the processes will be described.

Assembly Substrate Preparation Process

Figure 6:
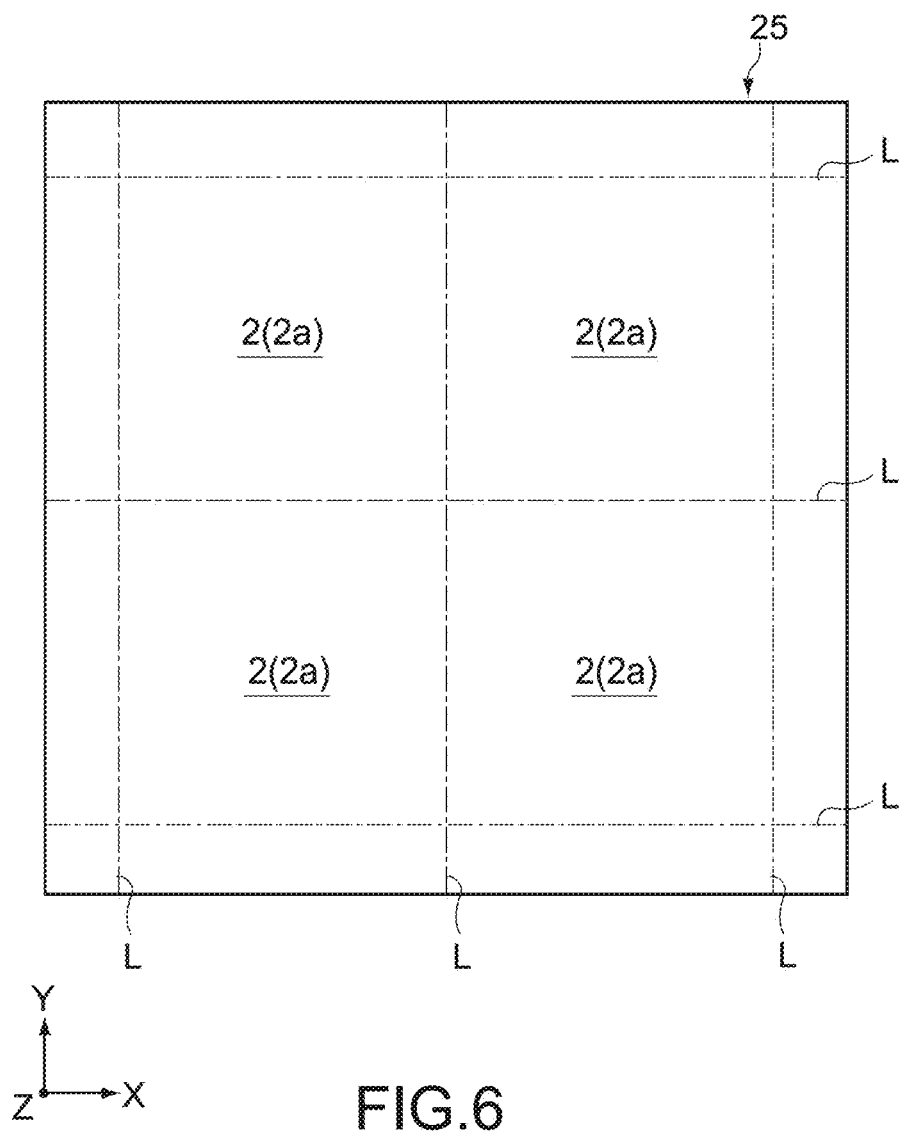
FIG. 6 is a diagram for explaining a production method for the circuit module.

FIG. 6 is an upper view schematically showing a structure of an assembly substrate 25. The assembly substrate 25 is constituted of a large-area substrate to which a plurality of wiring substrates 2 are attached. FIG. 6 shows separation lines L for sectioning the plurality of wiring substrates 2. The separation lines L may be virtual or may be actually printed on the assembly substrate 25.

By forming up to the conductive shield 5 on the assembly substrate 25 through the processes to be described later and cutting it out (full-cut) along the separation lines L in the final cutout process, a plurality of circuit modules 100 are produced from a single assembly substrate 25. Moreover, although not shown, predetermined wiring patterns (11, 23a, 23b, 23c, 23v, 24a, 24b, etc.) are formed for each of the areas constituting the wiring substrates 2 inside the assembly substrate 25.

It should be noted that although the example shown in the figure is an example of cutting out 4 wiring substrates 2 from a single assembly substrate 25, the number of wiring substrates 2 to be cut out is not particularly limited. For example, when a practically-square substrate of about 150 mm square is used as the assembly substrate 25, 4 wiring substrates 2 each of about 35 mm square is arranged in both the X- and Y-axis directions, that is, a total of 16 wiring substrates 2 are arranged. Furthermore, a rectangular substrate having a side of about 100 mm to 200 mm is typically used as the assembly substrate 25.

Electronic Component Mounting Process

Figure 7A:
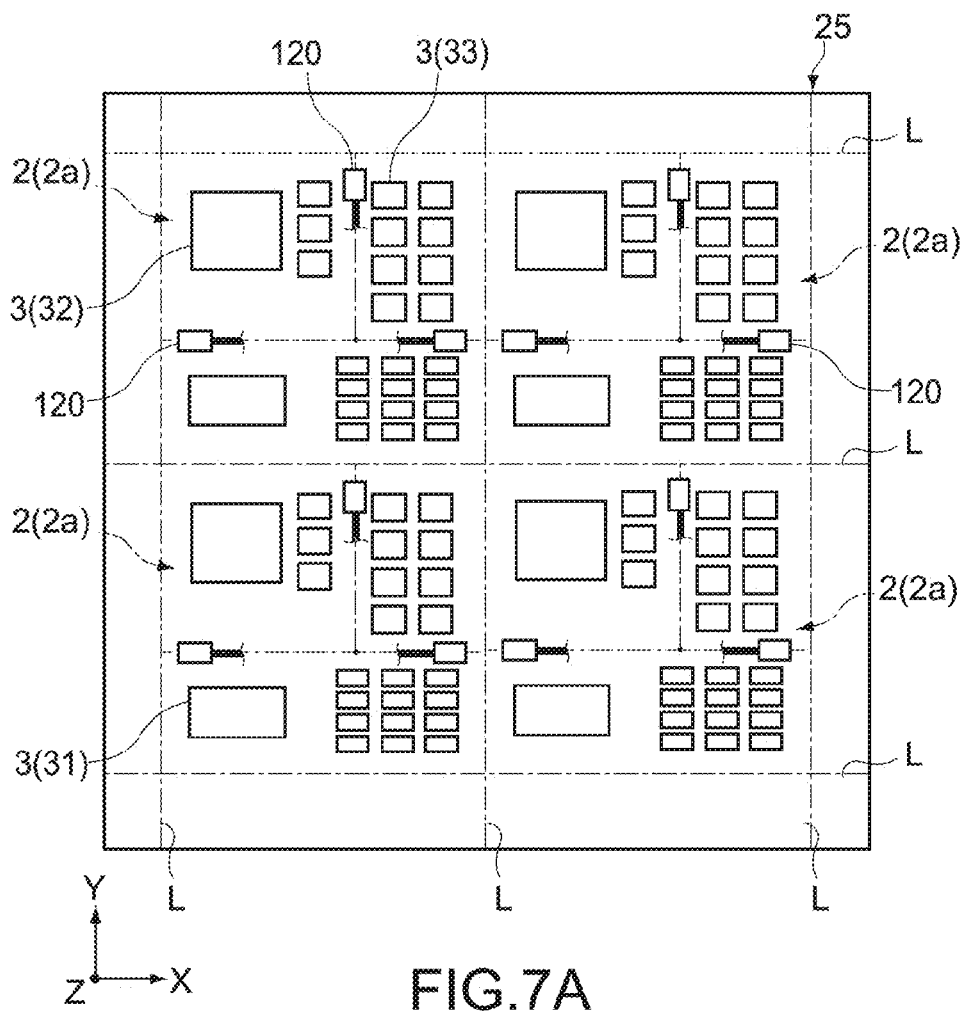
FIGS. 7A and 7B are diagrams for explaining the production method for the circuit module, FIG. 7A being a plan view showing an arrangement process of the electronic components and FIG. 7B being a cross-sectional diagram of a main portion thereof.
Figure 7B:
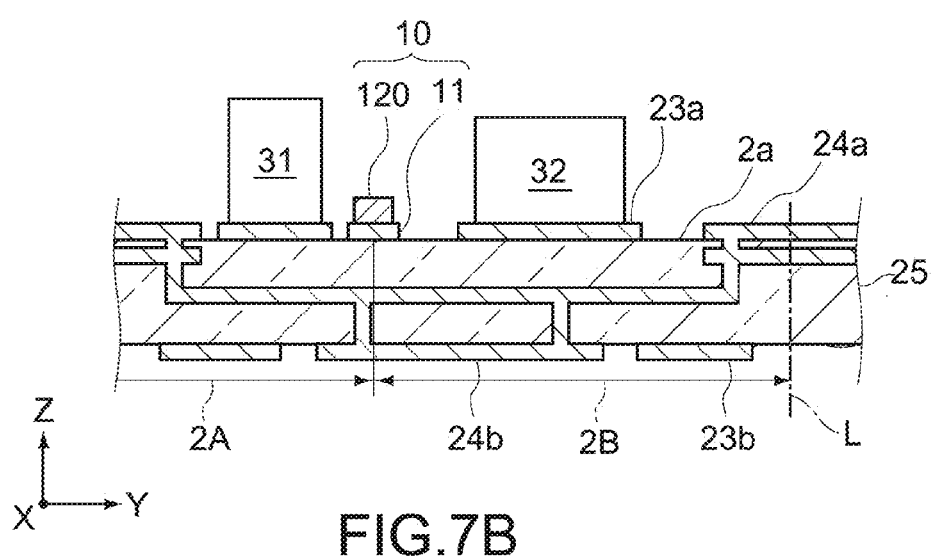

FIGS. 7A and 7B are diagrams for explaining the mounting process of the electronic components 3 (31 to 33) and an arrangement process of the metal components 120 and show a state where the electronic components 31 to 33 and the metal components 120 are mounted on the assembly substrate 25 (wiring substrates 2).

In this process, the plurality of electronic components 31 to 33 are mounted on each of the first to third areas 2A to 2C of the mounting surfaces 2A. A reflow method is adopted as the method of mounting the electronic components 31 to 33, for example. Specifically, a solder paste is first applied onto a predetermined land portion on each of the mounting surfaces 2A by a screen printing method or the like, and the plurality of electronic components 31 to 33 are then mounted on the predetermined land portions via the solder paste. After that, the assembly substrate 25 on which the electronic components 31 to 33 are mounted is charged into a reflow furnace to reflow the solder paste so that the electronic components 31 to 33 are electrically and mechanically bonded to the mounting surfaces 2A.

Metal Component Arrangement Process

In this process, a plurality of metal components 120 are additionally mounted on the mounting surfaces 2A. The metal components 120 are arranged in a predetermined area on the wiring portion 11 (connection area with respect to second shield portion 52) that is positioned on the boundaries of the first to third areas 2A to 2C. Such areas each correspond to the position at which the groove portion 41 is formed, which will be described later, and correspond to a position in the vicinity of the end portion of the groove portion 41 in this embodiment in particular. In this process, the metal components 120 are mounted on the mounting surfaces 2A by the reflow method simultaneous with the mounting process of the electronic components 31 to 33 described above (FIG. 7B).

Sealing Layer Forming Process

Figure 8A:
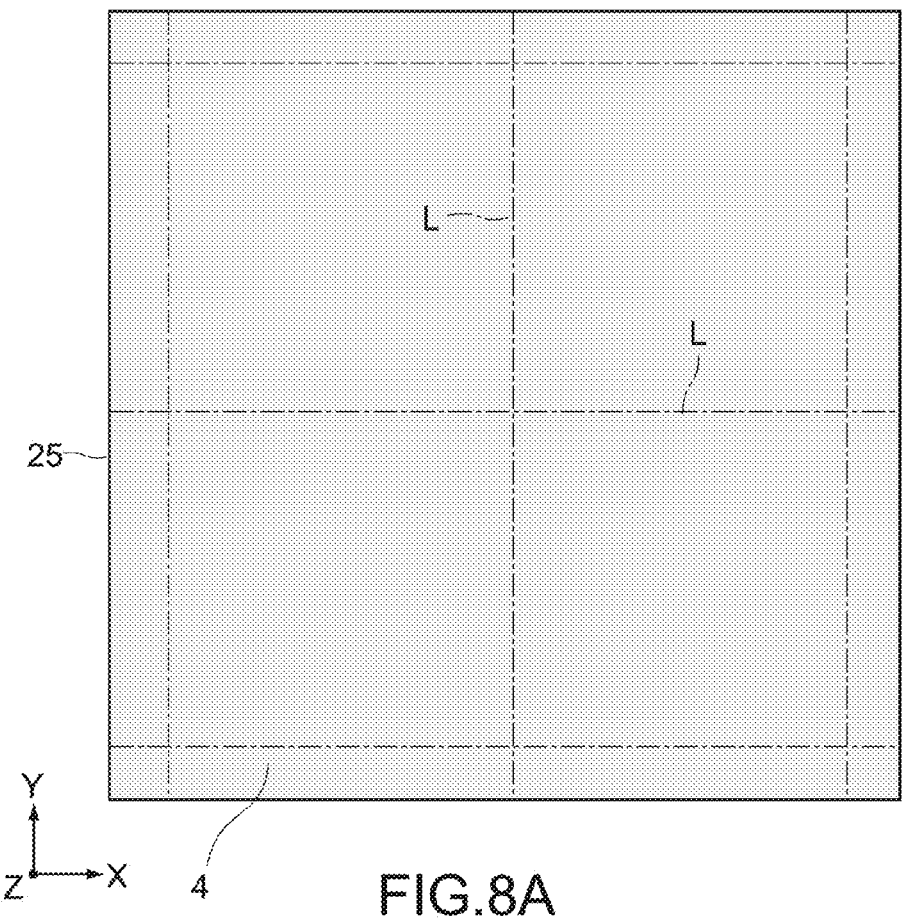
FIG. 8 are diagrams for explaining the production method for the circuit module, FIG. 8A being a plan view showing a sealing layer forming process and FIG. 8B being a cross-sectional diagram of a main portion thereof.
Figure 8B:
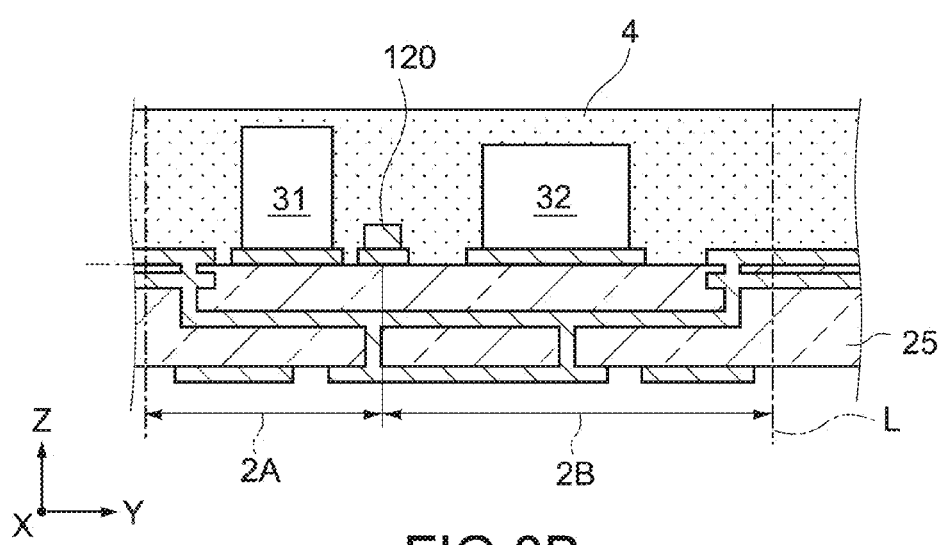

FIGS. 8A and 8B are diagrams for explaining the forming process of the sealing layer 4 and show a state where the sealing layer 4 is formed on the mounting surface 2A.

The sealing layer 4 is formed on each of the mounting surfaces 2A of the assembly substrate 25 so as to cover the plurality of electronic components 31 to 33 and metal components 120. The method of forming the sealing layer 4 is not particularly limited, and a mold forming method that uses a mold, a potting forming method that does not use a mold, and the like are applicable. Moreover, after applying a liquefied or paste-type sealing resin material onto the mounting surface 2A by a spin-coating method, a screen printing method, or the like, heat processing may be performed to cure the resin material.

Half-Cut Process

Figure 9A:
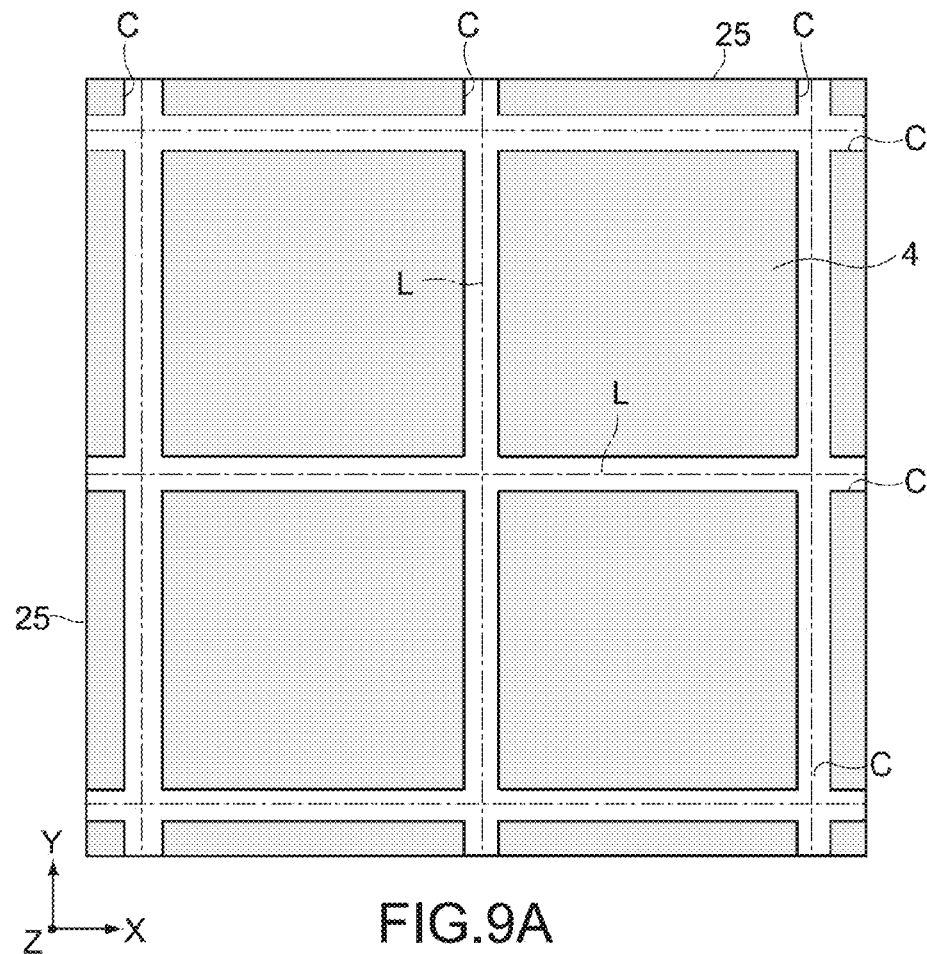
FIG. 9 are diagrams for explaining the production method for the circuit module, FIG. 9A being a plan view showing a half-cut process and FIG. 9B being a cross-sectional diagram of a main portion thereof.
Figure 9B:
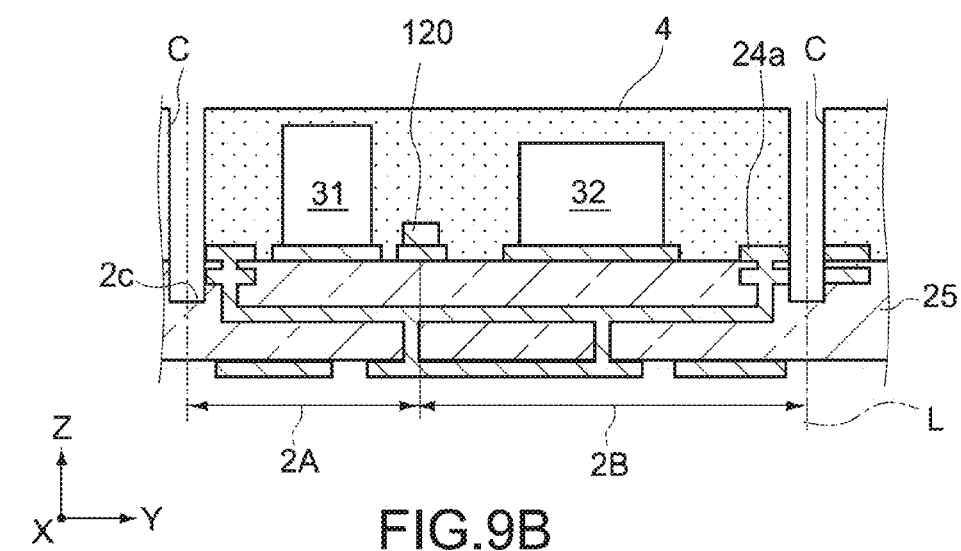

FIGS. 9A and 9B are diagrams for explaining the half-cut process. In this process, cut grooves C having a depth that reaches an inner portion of the assembly substrate 25 from the upper surface of the sealing layer 4 are formed along the separation lines L by a dicer, for example. The cut grooves C form the step portions 2C of the assembly substrate 25 (wiring substrates 2). The depth of the cut grooves C is not particularly limited, and the cut grooves C are formed with a depth with which the first GND terminal 24a on the assembly substrate 25 can be severed.

Groove Portion Forming Process

Figure 10A:
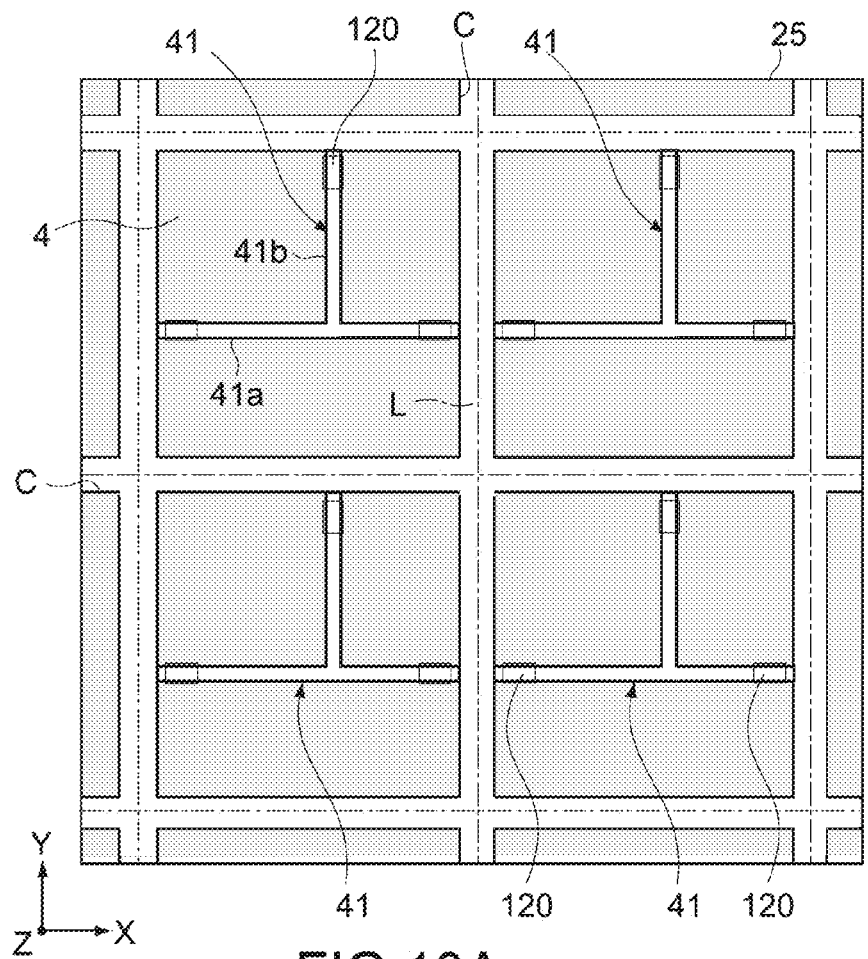
FIG. 10 are diagrams for explaining the production method for the circuit module, FIG. 10A being a plan view showing a groove portion forming process and FIG. 10B being a cross-sectional diagram of a main portion thereof.
Figure 10B:
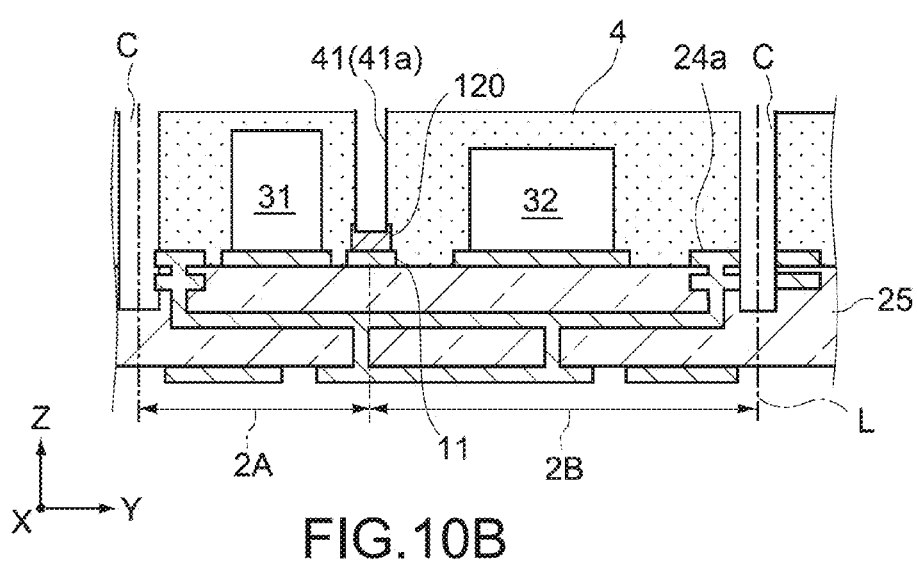

FIGS. 10A and 10B are diagrams for explaining the forming process of the groove portion 41. The groove portion 41 is formed along the boundaries of the first to third areas 2A to 2C on each of the mounting surfaces 2A. Specifically, the groove portion 41 includes a first groove portion 41a formed along the boundary between the first area 2A and the second and third areas 2B and 2C and a second groove portion 41b formed along the boundary between the second area 2B and the third area 2C.

The laser processing method is used in forming the groove portion 41. A $CO_2$ (carbon dioxide) laser, a YAG laser, or the like is typically used as the laser light. The laser light may either be a continuous wave or a pulse wave. The laser light is irradiated onto a setting area of the second shield portion 52 from the upper surface side of the sealing layer 4. By causing the resin material of the laser light irradiation area to partially melt or evaporate, the resin material is removed. The laser light scans the upper surface of the sealing layer 4 with/at a constant power and velocity, and thus the groove portions 41 are formed with almost-equal depths. The number of scanning times is not limited to 1, and the scanning may be repeated a plurality of times.

The width of the groove portion 41 is not particularly limited. However, a filling property of the conductive resin forming the second shield portion 52 is lowered as the width becomes smaller, and the mounting area of the electronic components 3 becomes smaller and it becomes more difficult to downsize the module as the width becomes larger. In this embodiment, the width of the groove portion 41 is set to be 0.05 mm to 0.3 mm.

The groove portion 41 is typically formed with a depth with which the bottom portion of the groove portion 41 reaches the vicinity of the mounting surface 2A. In this embodiment, the groove portion 41 is formed with a depth that reaches the metal component 120. Accordingly, the groove portion 41 having a depth with which the metal component 120 is exposed is formed on the sealing layer 4 along the boundaries of the first to third areas 2A to 2C. At this time, upper surfaces of the metal components 120 may be cut by the laser light irradiation. The point is, the metal component 120 only needs to prevent an open defect of the wiring portion 11 from occurring and a resistance value from increasing due to a change in the shape of the wiring portion 11, by being irradiated with laser light in place of the wiring portion 11 provided right below the metal component 120.

Furthermore, according to this embodiment, since the metal components 120 are provided in the vicinity of the end portions of the groove portions 41 (41a and 41b), the wiring portion 11 positioned at the start and end points of the groove portions 41 with relatively-large laser light irradiation amounts can be effectively protected from the laser light.

The procedure for forming the groove portion 41 is not particularly limited, and the second groove portion 41b may be formed after the first groove portion 41a, or the first groove portion 41a may be formed after the second groove portion 41b. Moreover, an oscillation wavelength, oscillation power, and the like of the laser light are not particularly limited and can be set as appropriate based on the resin material forming the sealing layer 4, a laser light resistance of the metal component 120, and the like. As an example, the laser light is set to have a laser power with which the resin can be removed at a processing rate in which a depth per 1 scan is about 0.1 mm to 0.4 mm.

Conductive Shield Forming Process

Figure 11A:
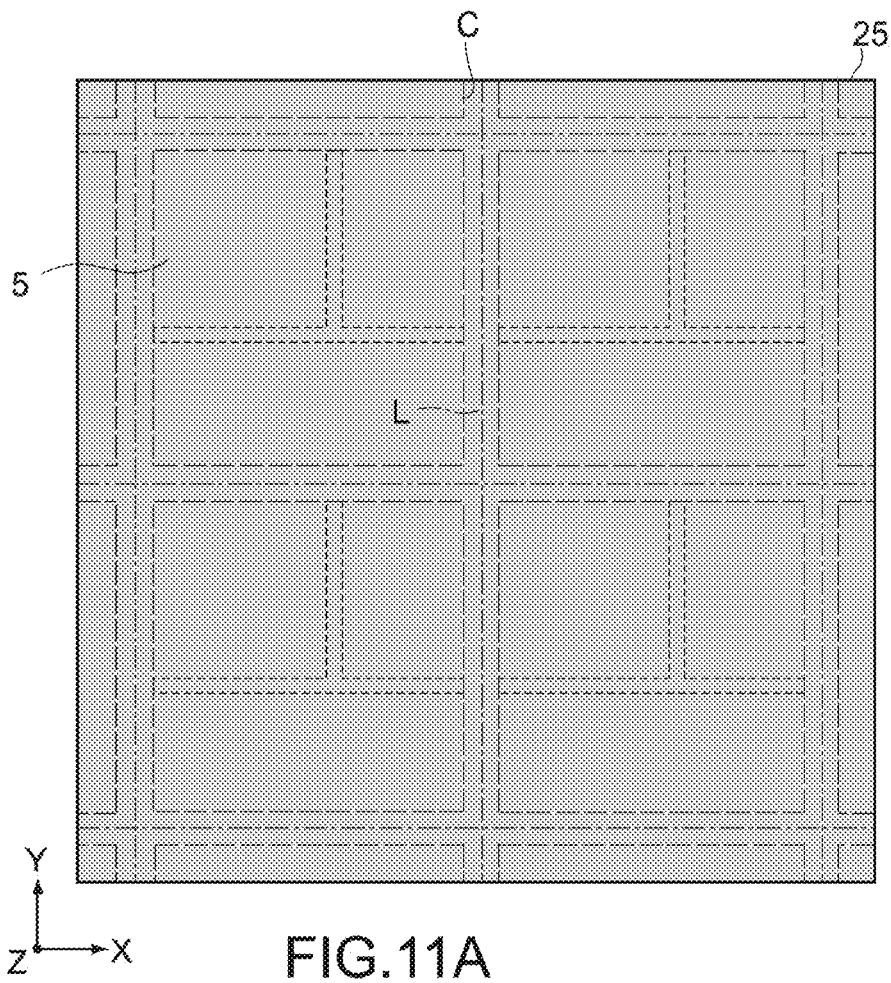
FIG. 11 are diagrams for explaining the production method for the circuit module, FIG. 11A being a plan view showing a conductive shield forming process and FIG. 11B being a cross-sectional diagram of a main portion thereof.
Figure 11B:
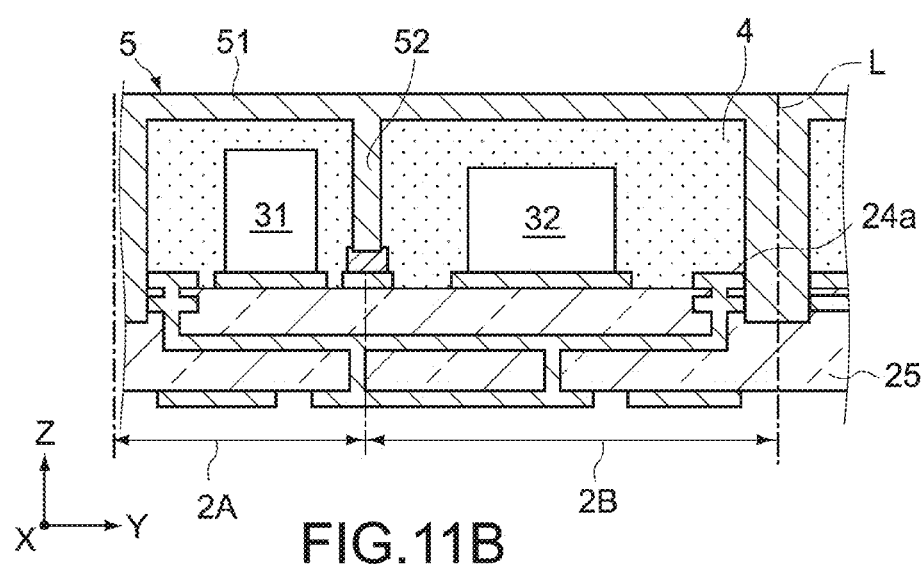

FIGS. 11A and 11B are diagrams for explaining the forming process of the conductive shield 5. The conductive shield 5 is formed on the sealing layer 4. With this structure, a first shield portion 51 that covers an outer surface of the sealing layer 4 and a second shield portion 52 provided in the groove portion 41 are formed.

In this embodiment, the conductive shield 5 is formed by applying or filling the conductive resin or conductive paint onto or in the front surface of the sealing layer 4. The forming method is not particularly limited, and a mold forming method that uses a mold, a potting forming method that does not use a mold, and the like are applicable. Moreover, after applying a liquefied or paste-type sealing resin material onto the sealing layer 4 by a spin-coating method, a screen printing method, or the like, heat processing may be performed to cure the resin material. Furthermore, for enhancing filling efficiency of the conductive resin in the groove portion 41, the process may be executed in a vacuum atmosphere.

The second shield portion 52 is filled inside the groove portion 41. With this structure, the second shield portion 52 is bonded to the metal component 120 exposed from the bottom surface of the groove portion 41. In this embodiment, since the first shield portion 51 and the second shield portion 52 are formed of the same material, an electrical conduction between the first shield portion 51 and the second shield portion 52 and a desired bonding intensity between the first shield portion 51 and the second shield portion 52 are secured.

By also filling the conductive resin forming the first shield portion 51 into the cut grooves C formed on the sealing layer 4, the first shield portion 51 is bonded with the first GND terminal 24a on the wiring substrate 2 facing the cut grooves C. Accordingly, the first shield portion 51 and the first GND terminal 24a are electrically and mechanically connected to each other.

A vacuum deposition method such as a plating method and a sputtering method may be adopted for forming the conductive shield 5. In the former case, the conductive shield 5 can be formed by immersing the assembly substrate 25 in a plating bath and depositing a plated film on the outer surface of the sealing layer 4 and an inner wall surface of the groove portion 41. In the latter case, the conductive shield 5 can be formed by loading the assembly substrate 25 into a vacuum chamber and sputtering a target constituted of a conductive material so that a sputtered film is deposited on the outer surface of the sealing layer 4 and the inner wall surface of the groove portion 41. In this case, the plated film or the sputtered film does not need to be filled inside the groove portion 41.

Cutout Process

Figure 12A:
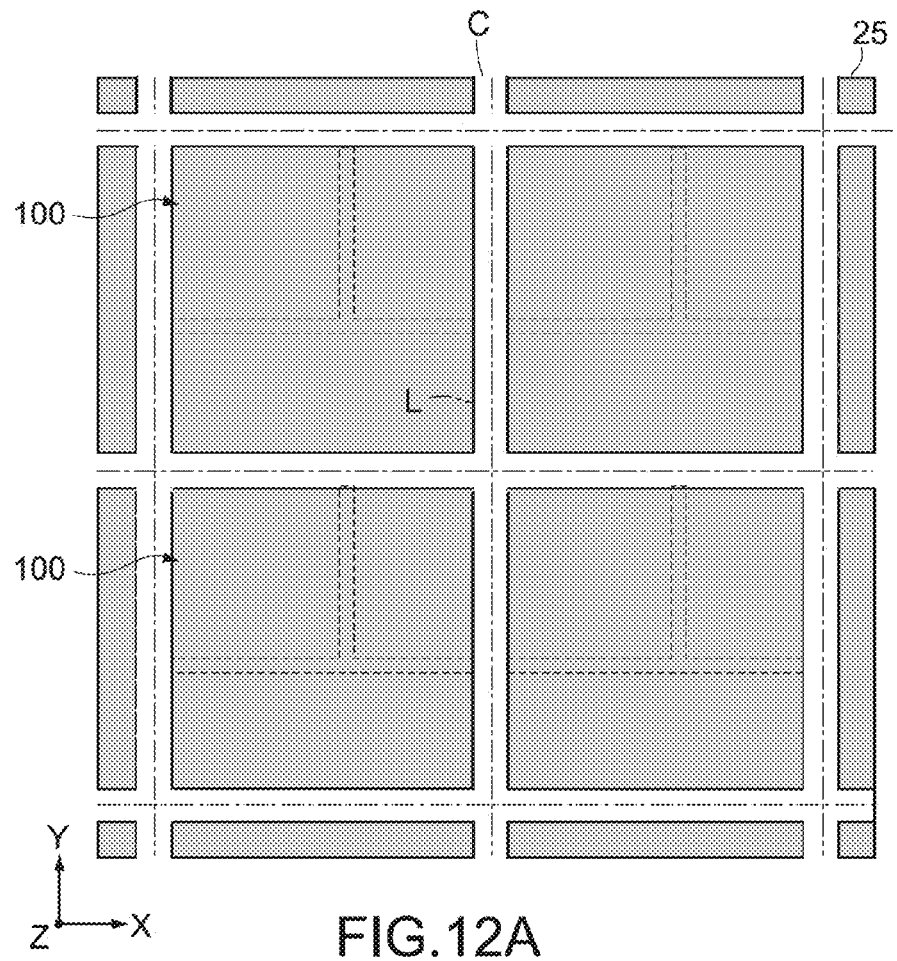
FIG. 12 are diagrams for explaining the production method for the circuit module, FIG. 12A being a plan view showing a singulation process and FIG. 12B being a cross-sectional diagram of a main portion thereof.
Figure 12B:
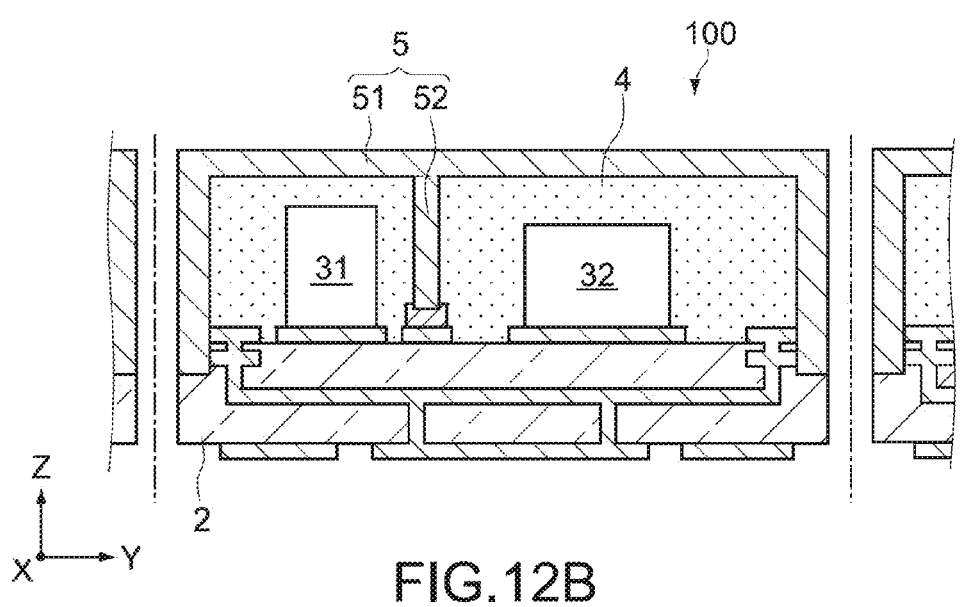

FIGS. 12A and 12B are diagrams for explaining the cutout process. In this process, the assembly substrate 25 undergoes full-cut along the separation lines L so that a plurality of circuit modules 100 are singulated. In the separation, a dicer is used, for example. In this embodiment, since the conductive shield 5 is also filled inside the cut grooves C, the wiring substrate 2 and the conductive shield 5 (first shield portion 51) are structured to have the same cutout surface when separated along the separation lines L. Accordingly, the circuit module 100 including the conductive shield 5 that covers the front surface of the sealing layer 4 (upper and side surfaces) and a part of the side surfaces of the wiring substrate 2 is produced.

Operation of this Embodiment

The circuit module 100 is produced by the processes described above. According to the production method for a circuit module of this embodiment, the circuit module 100 including the conductive shield 5 that includes the first shield portion 51 for preventing electromagnetic waves from leaking to the outside of the module and preventing electromagnetic waves from entering from the outside and the second shield portion 52 for preventing an electromagnetic interference from occurring among the plurality of electronic components inside the module can be produced.

According to this embodiment, since the laser processing method is used in forming the groove portion 41 of the sealing layer 4 in which the second shield portion 52 is provided, the groove portion 41 can be formed in an arbitrary shape (e.g., bent shape, zigzag shape, and curved shape) as compared to a case of forming the groove portion by a dicing method. As a result, the degree of freedom in design of the second shield portion 52 can be enhanced.

In general, when forming a groove on a sealing layer by a laser cut, it is extremely difficult to adjust an optimal laser power for positively processing only a resin without damaging a wiring pattern present on a groove bottom portion. Moreover, since a smear (residue of resin or filler) remains on the groove bottom portion, de-smear processing is necessary as a post process. A method of physically removing a smear by dry etching or a method of chemically removing a smear using a strong alkaline drug solution or the like is normally adopted for the de-smear processing, but the processing becomes more difficult as an aspect ratio of the groove (width/depth) increases. Therefore, since an electrical connection with respect to the wiring pattern right below the groove is inhibited even when the conductive resin is filled inside the groove, there have been cases where favorable shield performance cannot be secured.

In this regard, by structuring the conductive layer 10 that leads the second shield portion 52 to the GND terminal by the wiring portion 11 and the thickening portion 12 (metal component 120), the thickening portion 12 is exposed from the bottom portion of the groove portion 41 without the smear remaining by processing the thickening portion 12 by a laser under an excessive condition when forming the groove portion 41, and the wiring portion 11 is protected from the laser light irradiation. Accordingly, an electrical contact between the second shield portion 52 provided in the groove portion 41 and the wiring portion 11 can be secured, and the groove portion 41 can be stably and easily formed without burning off the wiring portion 11 by the laser.

Further, in this embodiment, means for thickening the wiring portion 11 by providing the thickening portion 12 (metal component 120) in advance at key spots where the shield effect is emphasized in particular is adopted. Accordingly, since the laser at least reaches the area where the thickening portion 12 is provided faster than other areas, even when the thickening portion 12 is somewhat cut by the laser as described above, the wiring portion 11 below the thickening portion 12 can be prevented from being burned off. Further, the other areas are not damaged by an effect of a precise laser process.

Further, since the groove portion 41 is formed by the laser processing method in this embodiment, a higher depth accuracy than in the case of forming a groove portion by the dicing method can be obtained. Moreover, since the wiring portion 11 right below the groove portion 41 is formed of a material having high reflectance characteristics with respect to laser light (solder, copper, nickel, brass, gold plating, etc.), the wiring portion 11 is effectively protected from the laser damage. Since the wiring portion 11 can be formed right below the groove portion 41 in this embodiment as described above, the circuit module 100 having a high degree of freedom in the wiring design can be provided.

Second Embodiment

Figure 13:
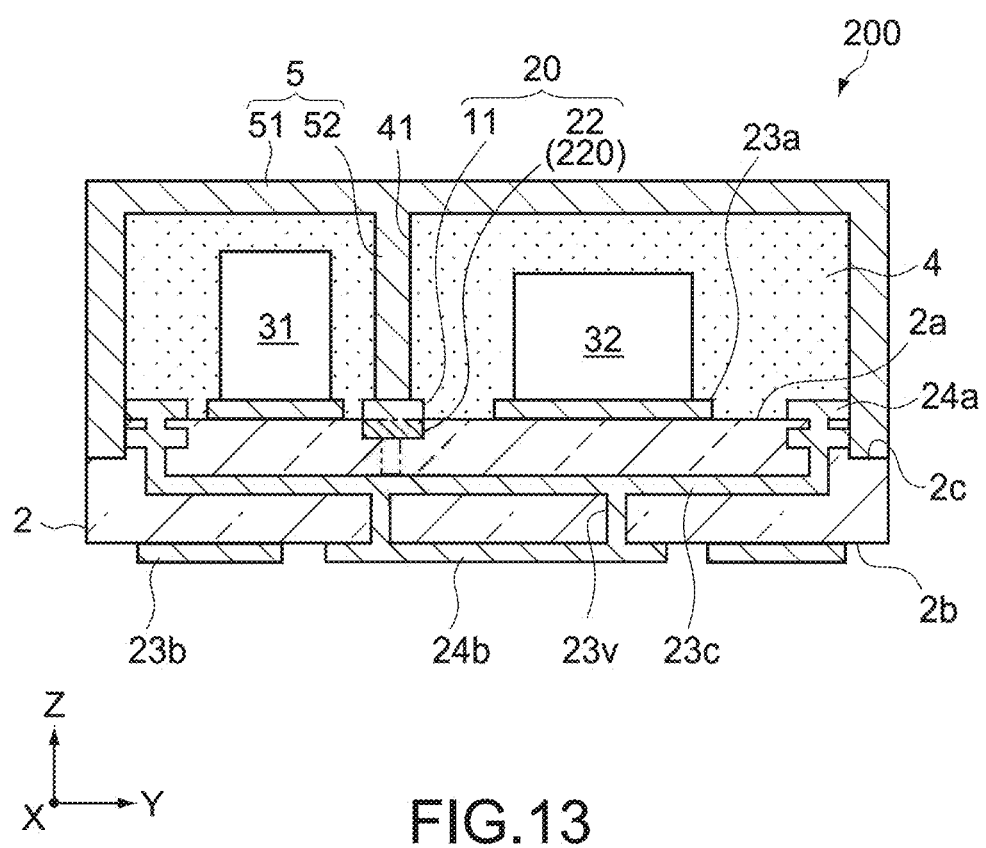
FIG. 13 is a cross-sectional diagram showing a main portion of a circuit module according to a second embodiment of the present disclosure.
Figure 14:
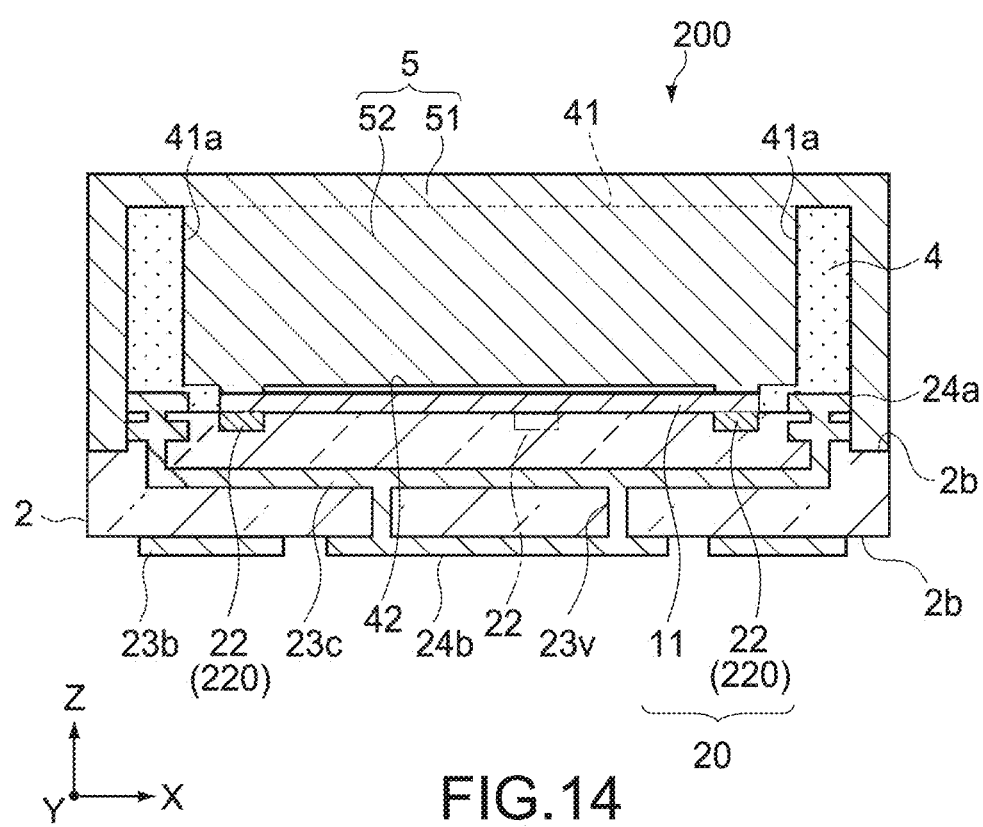
FIG. 14 is a cross-sectional diagram showing other main portions of the circuit module.

FIGS. 13 and 14 are cross-sectional side views showing a main portion of a circuit module according to a second embodiment of the present disclosure and respectively correspond to the cross-sectional diagrams shown in FIGS. 4 and 5. Hereinafter, structures different from those of the first embodiment will mainly be described. In addition, structures that are the same as those of the first embodiment will be denoted by the same symbols, and descriptions thereof will be omitted or simplified.

In a circuit module 200 of this embodiment, the structure of the thickening portion for partially thickening the connection area of the wiring portion 11 with respect to the second shield portion 52 is different from that of the first embodiment. Specifically, a conductive layer 20 of this embodiment includes the wiring portion 11 that electrically connects the terminal surface 2B provided on the mounting surface 2A of the wiring substrate 2 and the second shield portion 52 and a thickening portion 22 that is provided in the wiring portion 11 and partially thickens the connection area of the wiring portion 11 with respect to the second shield portion 52. The thickening portion 22 is constituted of a metal layer 220.

The metal layer 220 is buried in the insulation layer of the wiring substrate 2 and connected to a part of the area of the wiring portion 11. The part of the area is typically an area in the vicinity of the end portion 41a of the groove portion 41 as in the first embodiment or an area right below a portion where the groove portion 41 is bent or branched.

The metal layer 220 may be a through-hole via that connects the wiring portion 11 to the inner layer wiring portion 23c. In this case, the through-hole via is constituted of a via having a plug structure that has an inner portion filled with a conductive material.

The metal layer 220 has a function of partially thickening the wiring portion 11. The type of conductive material is not particularly limited, and metal materials such as a solder, copper, nickel, and brass are favorable.

The metal layer 220 has an enough volume to avoid an open defect of the conductive layer 20 and the like even when the wiring portion 11 right above the metal layer 220 is partially cut by the laser light. Accordingly, an electrical conduction between the second shield portion 52 and the second GND terminal 24b can be secured. Therefore, the metal layer 220 is formed with a thickness and size with which the function of the conductive layer 20 can be secured. Specifically, the thickness of the metal layer 220 is equal to or larger than the thickness of the wiring portion 11, for example.

Figure 15A:
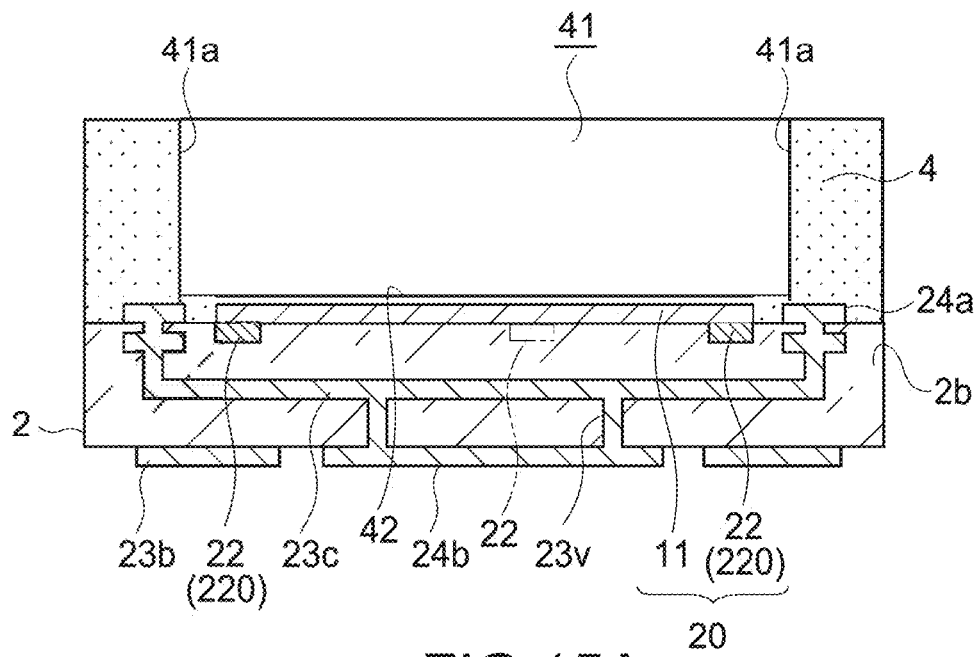
FIG. 15 are diagrams for explaining the production method for the circuit module, FIG. 15A being a cross-sectional diagram of a main portion in first laser processing and FIG. 15B being a cross-sectional diagram of the main portion in second laser processing.
Figure 15B:
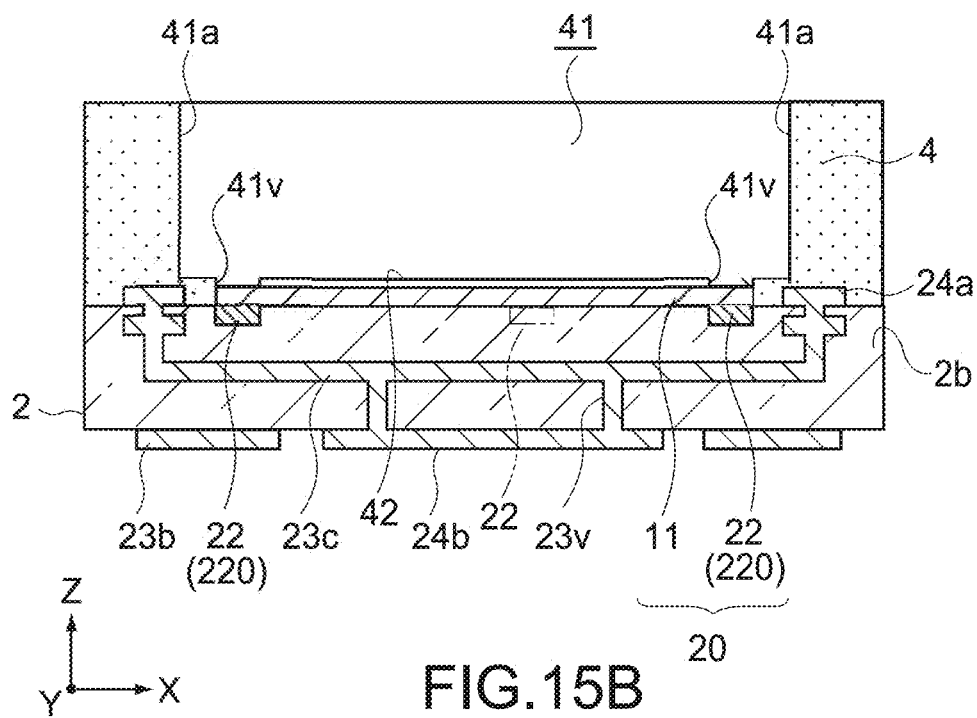

Next, a production method for the circuit module 200 will be described. FIGS. 15A and 15B are cross-sectional diagrams of a main portion for explaining the production method for the circuit module 200 and show the forming process of the groove portion 41.

It should be noted that in the assembly substrate preparation process, the wiring substrate 2 (assembly substrate 25) including the conductive layer 20 in which the metal layer 220 is provided in a predetermined area of the wiring portion 11 is prepared in advance. Moreover, since the electronic component mounting process, the sealing layer forming process, the half-cut process, the conductive shield forming process, and the cutout process are the same as those of the first embodiment, descriptions thereof will be omitted.

In this embodiment, the groove portion 41 is formed through first laser processing and second laser processing.

In the first laser processing, by irradiating first laser light onto the front surface of the sealing layer 4, the groove portion 41 having a depth with which the conductive layer 20 is almost exposed from the sealing layer 4 is formed along the boundaries of the first to third areas 2A to 2C as shown in FIG. 15A.

Since the groove portion 41 is formed with a depth that is close to the entire thickness of the sealing layer 4 in the first laser processing, an oscillation condition under which the groove portion 41 can be efficiently formed while leaving the insulation layer 42 having a predetermined thickness on the front surface of the wiring portion 11 is adopted for the first laser light. The thickness of the insulation layer 42 is not particularly limited and set to be, for example, 5 μm to 10 μm. A $CO_2$ laser is adopted as the first laser light, for example. Since a difference in an absorption coefficient of the $CO_2$ laser with respect to a resin and that of the $CO_2$ laser with respect to metal is large, the groove portion 41 can be formed efficiently.

In the second laser processing, by irradiating second laser light onto the bottom portion of the groove portion 41 at a position right above the area where the metal layer 220 of the conductive layer 20 is provided, the area is exposed via the groove portion 41 as shown in FIG. 15B.

By irradiating the second laser light onto the insulation layer 42 covering each area of the wiring portion 11 where the metal layer 220 is provided in the second laser processing, vias 41v that connect the groove portion 41 and the wiring portion 11 are formed. Accordingly, the conductive resin filled inside the groove portion 41 in the forming process of the second shield portion 52 is connected to the conductive layer 20 via the vias 41v, and thus a favorable shield effect of the second shield portion 52 can be secured.

The second laser light is set to have a laser power sufficient to process the thin insulation layer 42. Accordingly, the laser damage of the wiring portion 11 right below the insulation layer 42 can be reduced. A YAG laser is used as the second laser light, for example. Accordingly, the insulation layer 42 can be processed without causing a smear in the vias 41v.

The groove portion 41 in which the second shield portion 52 is provided is formed as described above. This embodiment bears the same effect as the first embodiment above.

According to this embodiment, since the thickening portion 22 is constituted of the metal layer 220 provided at the bottom portion of the wiring portion 11, a mounting area of the electronic components on the mounting surface 2A can be secured, and thus the module can be downsized.

Heretofore, the embodiments of the present disclosure have been described. However, the present disclosure is not limited thereto and can be variously modified based on the technical idea of the present disclosure.

For example, although the wiring portion 11 constituting the conductive layers 10 and 20 is formed as a part of the upper layer wiring portion 23a of the wiring substrate 2 in the embodiments above, the present disclosure is not limited thereto, and the wiring portion 11 may be constituted of a wiring layer different from the upper layer wiring portion 23a. In this case, the wiring portion 11 may be structured using a wiring layer thicker than the upper layer wiring portion 23a. Accordingly, resistance of the wiring portion 11 with respect to the laser light irradiation can be additionally enhanced.

Moreover, although the metal layer 220 is provided on the lower surface (bottom portion) of the wiring portion 11 in the second embodiment, the metal layer may instead be provided on an upper surface of the wiring portion 11. In this case, the metal layer has the same function as the metal component shown in the first embodiment, and the same operational effect as the first embodiment can be obtained.

Furthermore, although the embodiments above have shown the example where the wiring substrate 2 is constituted of a printed-wiring substrate, the present disclosure is not limited thereto, and the wiring substrate 2 may be constituted of a semiconductor substrate such as a silicon substrate. Moreover, the electronic components 3 may be various actuators such as a MEMS (Micro Electro Mechanical System) component.

The present disclosure contains subject matter related to that disclosed in Japanese Priority Patent Application JP 2013-076887 filed in the Japan Patent Office on Apr. 2, 2013, the entire content of which is hereby incorporated by reference.

What is claimed is:

1. A circuit module, comprising:
    a wiring substrate including a mounting surface having a first area and a second area and a terminal surface on the other side of the mounting surface;
    a plurality of electronic components mounted on the first area and the second area;
    a sealing layer that covers the plurality of electronic components, is formed of an insulation material, and includes a groove portion formed along a boundary between the first area and the second area;
    a conductive shield including a first shield portion that covers an outer surface of the sealing layer and a second shield portion provided in the groove portion; and
    a conductive layer including a wiring portion that is provided on the mounting surface and electrically connects the terminal surface and the second shield portion, and a thickening portion that is provided in the wiring portion and partially thickens a connection area of the wiring portion with respect to the second shield portion.

2. The circuit module according to claim 1, wherein the thickening portion is provided in the vicinity of an end portion of the groove portion.

3. The circuit module according to claim 1, wherein the thickening portion is provided right below a portion where the groove portion is bent.

4. The circuit module according to claim 1, wherein the thickening portion is provided right below a portion where the groove portion is branched.

5. The circuit module according to claim 1, wherein the thickening portion is a metal layer that is formed in the connection area and includes one of a solder, copper, and nickel.

6. The circuit module according to claim 1, wherein the thickening portion is a metal component mounted in the connection area.

7. The circuit module according to claim 1, wherein the thickening portion is a through-hole via formed in the connection area.

8. The circuit module according to claim 1, wherein the second shield portion is a cured object of a conductive resin filled inside the groove portion.

9. The circuit module according to claim 1, wherein the second shield portion is one of a plated film and a sputtered film filled inside an inner wall of the groove portion.

* * * * *